United States Patent
Itsuji

(10) Patent No.: US 8,513,940 B2
(45) Date of Patent: Aug. 20, 2013

(54) METHOD OF MEASURING TERAHERTZ WAVE AND APPARATUS THEREFOR

(75) Inventor: Takeaki Itsuji, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 336 days.

(21) Appl. No.: 13/096,916

(22) Filed: Apr. 28, 2011

(65) Prior Publication Data

US 2011/0285383 A1 Nov. 24, 2011

(30) Foreign Application Priority Data

May 18, 2010 (JP) .................................. 2010-113829
Mar. 4, 2011 (JP) .................................. 2011-047736

(51) Int. Cl.
*G01R 31/00* (2006.01)

(52) U.S. Cl.
USPC ............................................................. 324/96

(58) Field of Classification Search
USPC ................... 324/762.01–762.1, 96; 257/48; 438/14–18; 250/341.1, 252.1, 339.07
See application file for complete search history.

(56) References Cited

U.S. PATENT DOCUMENTS 7,282,926 B1 * 10/2007 Verspecht et al. ............. 324/637
7,906,764 B2 * 3/2011 Itsuji .......................... 250/341.1

FOREIGN PATENT DOCUMENTS

JP 2007-292600 A 11/2007
JP 2008-020268 A 1/2008

* cited by examiner

*Primary Examiner* — Tung X Nguyen
(74) *Attorney, Agent, or Firm* — Canon U.S.A., Inc. IP Division

(57) ABSTRACT

In a measurement of a time-domain waveform of a terahertz wave based on time-domain spectroscopy, a current signal including a component originating from the terahertz wave is detected using a photoconductive device, and a voltage signal corresponding to the detected current signal is detected. At a pre-processing stage before the voltage signal detection, an offset current included in the detected current signal and having no relation to the terahertz wave is drawn. The offset current is monitored and the magnitude of the drawn offset current is adjusted according to a result of the monitoring. A time-domain waveform of the terahertz wave is acquired based on the voltage signal detected while drawing the offset current. The monitoring of the offset current and the adjusting of the offset current are performed in a waiting state in which measurement of the time-domain waveform of the terahertz wave is not performed.

13 Claims, 9 Drawing Sheets

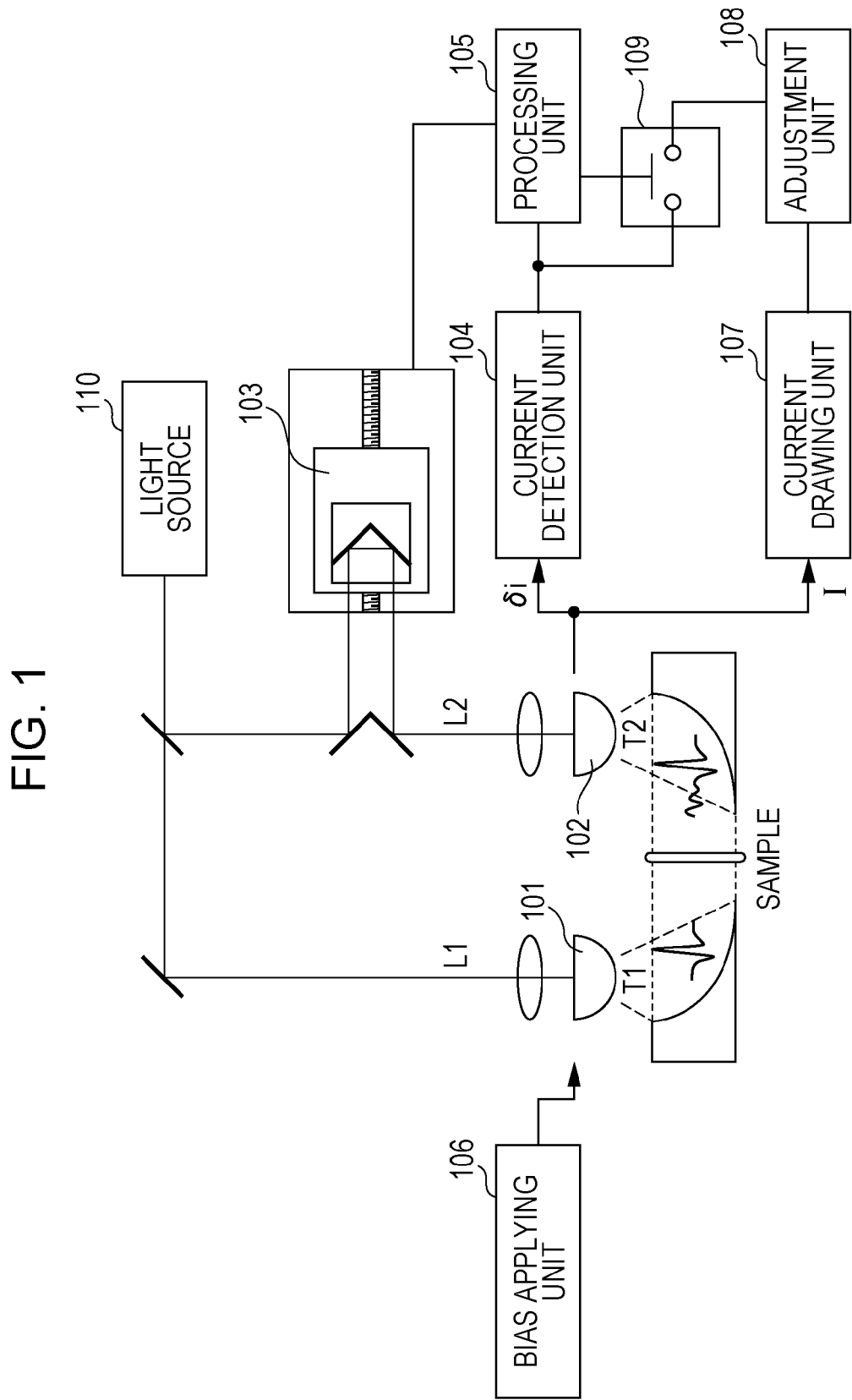

METHOD OF MEASURING TERAHERTZ WAVE AND APPARATUS THEREFOR

BACKGROUND OF THE INVENTION

1. Field of the Invention

The present invention relates to an apparatus and a method of measuring a terahertz wave, and particularly, to an apparatus and a method of measuring a terahertz wave in time domain. Hereinafter, such as an apparatus will be also referred to as a THz TDS (Time Domain Spectroscopy) apparatus. More particularly, the present invention relates to a technique to suppress an offset current in a measuring apparatus.

2. Description of the Related Art

A terahertz (THz) wave is an electromagnetic wave with a frequency in an arbitrary frequency band within a range from 0.03 THz to 30 THz. This frequency range includes frequencies or bands of frequency at which characteristic absorption occurs due to structures or states of substances such as biological molecules. This characteristic absorption feature is useful to nondestructively analyze or identify a substance. Active efforts are currently being made to develop testing techniques using this feature. One example of an expected application is a safety imaging technique that can enhance or potentially replace an X-ray imaging technique. Another example of an application of terahertz waves is the development of a high-speed communication technique.

In time domain (a concept that allows the analysis of mathematical functions or physical signals with respect to time), terahertz waves generally have the form of a pulse with a width of sub-pico seconds. Due to the slow response that current electronics have with respect to the speed of THz waves, it is generally difficult to acquire such a pulse in real time. For this reason, a THz-based apparatus operating in the Time Domain Spectrum (hereafter "THz-TDS apparatus") employs a sampling measurement technique using ultrashort pulsed light with a pulse width in the order of femto seconds. The sampling of the terahertz wave is achieved by adjusting a difference between a time at which excitation light arrives at a generating unit that generates the terahertz wave and a time at which the excitation light arrives at a sensor unit that senses the terahertz wave. For example, the time difference can be produced by a stage having a folded optical system (also referred to as an optical delay unit in the present description) provided in a propagation path of the excitation light. More specifically, the time difference is produced by adjusting the total round-trip length of the optical path of the excitation light in the folded optical system (see, for example, Japanese Patent Laid-Open No. 2008-20268). In many cases, the generating unit and/or the sensor unit are implemented using a photoconductive device including an antenna electrode pattern having a small gap formed on a semiconductor film.

Another obstacle in detecting a terahertz wave is that a signal of a terahertz wave output from the sensor unit is extremely low in strength. To handle such a weak signal, efforts have been made to develop techniques to increase the signal-to-noise ratio of measuring apparatuses. For example, it has been proposed to reduce background noise of a measuring apparatus by subtracting a signal that appears in a state where there is no terahertz wave from a signal obtained in a state where a solid-state image pickup device is irradiated with a terahertz wave. In this proposed technique, the sensor unit is realized using not a photoconductive device but a solid-state image pickup device (see, for example, Japanese Patent Laid-Open No. 2007-292600).

The technique disclosed in Japanese Patent Laid-Open No. 2007-292600 may be combined with the technique disclosed in Japanese Patent Laid-Open No. 2008-20268 such that the signal output from the photoconductive device is acquired in a state in which the photoconductive device is irradiated with the terahertz wave and the signal is also acquired in a state where no terahertz wave strikes the photoconductive device (to obtain background noise), and the difference between these two signals is determined. The signal output from the photoconductive device is in the form of a current signal, and thus a current-voltage conversion circuit (also referred to as a current detection unit in the present description) is generally used to detect the signal. To increase the signal-to-noise ratio of the measuring apparatus, the current detection unit may be configured to have a high current-to-voltage conversion ratio. However, a rated output is defined for the circuit depending on its circuit configuration, and the output of the circuit is limited by the rating. In particular, in a case where background noise (in the present description, a current signal corresponding to the background noise is also referred to as an offset current) is large, it is necessary to limit the current-to-voltage conversion ratio such that the output of the current detection unit is not saturated. That is, to achieve a further improvement in the signal-to-noise ratio of the measuring apparatus, the current-to-voltage conversion ratio for the signal component of the terahertz wave (obtained by subtracting the background noise) may be set to be as large as possible within a range that does not exceed the rating of the circuit.

SUMMARY OF THE INVENTION

In accordance with at least one embodiment, the present invention provides a method of measuring a time-domain waveform of a terahertz wave based on time-domain spectroscopy, the method includes: detecting, by a photoconductive device, a current signal including a current signal component originating from the terahertz wave; detecting a voltage signal corresponding to the detected current signal; drawing, at a pre-processing stage before the voltage signal detection, an offset current that is included in the detected current signal and that has no relation to a change in electric field of the terahertz wave; monitoring the offset current based on the detected voltage signal and adjusting the magnitude of the drawn offset current according to a result of the monitoring; and acquiring a time-domain waveform of the terahertz wave based on the voltage signal detected while drawing the offset current. The monitoring of the offset current and the adjusting of the offset current are performed in a waiting state in which measurement of the time-domain waveform of the terahertz wave is not performed.

In the method according to the aspect of the present invention, the offset current having no relation to a change in the electric field of a terahertz wave that reaches the sensor unit is determined in the waiting state. In the measurement, the offset current is subtracted from the current signal input to the current detection unit to detect only the signal component originating from the change in the electric field of the terahertz wave. This makes it possible to improve the signal-to-noise ratio of the measured wave.

Further features of the present invention will become apparent to persons having ordinary skill in the art from the following description of exemplary embodiments with reference to the attached drawings.

BRIEF DESCRIPTION OF THE DRAWINGS

FIG. 1 is a diagram illustrating an example of a configuration of a measurement apparatus according to an embodiment of the invention.

DESCRIPTION OF THE EMBODIMENTS

Figure 2A:
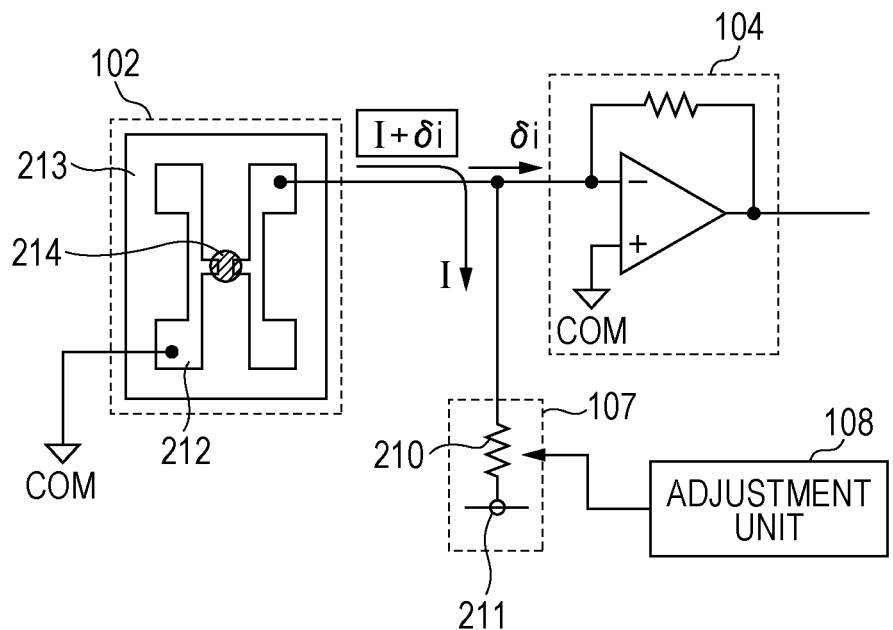
FIG. 2A is a diagram illustrating an example of a configuration associated with a current drawing unit.

In an apparatus and a method of acquiring a time-domain waveform of a terahertz wave using time-domain spectroscopy according to an embodiment of the present invention, a current signal detected using a photoconductive device is treated as follows. An offset current, which is included in the detected current signal but which has no relation to a change in the electric field of a terahertz wave, is drawn at an input part or at the beginning of the processing of detecting a voltage signal corresponding to the current signal. The offset current is monitored based on the voltage signal and the amount of the offset current drawn is adjusted based on a result of the monitoring. The time-domain waveform of the terahertz wave is acquired based on the voltage signal while drawing the offset current. The monitoring and adjusting of the offset current is performed in a waiting state in which the measurement of the time-domain waveform of the terahertz wave is not performed. A basic configuration of the apparatus and the method of acquiring the time-domain waveform of the terahertz wave using time-domain spectroscopy according to an aspect of the invention have been described.

Next, specific embodiments of the invention are described below with reference to the accompanying drawings. In an embodiment of the present invention, an offset current included in the output from a sensor unit 102 is suppressed, and a baseline of a produced terahertz time-domain waveform is corrected. In the present embodiment of the invention, the offset current refers to a signal output by the sensor unit 102 in a state in which no or substantially no terahertz wave is input to the sensor unit 102. The offset current has substantially no relation to the terahertz time-domain waveform and thus the offset current can be regarded as one type of background noise. In a case where a photoconductive device described below is used as the sensor unit 102, the offset current appears as a signal originating from carriers generated steadily by excitation light striking the photoconductive device. If a change in the current caused by a change in electric field of a terahertz wave is detected in a state in which the offset current is suppressed, a current detection unit 104 can use a circuit having a high current-to-voltage conversion ratio, which allows an increase in the signal-to-noise ratio of the apparatus. In a conventional technique, a signal obtained in a state in which a terahertz wave is input and a signal obtained in a state in which no terahertz wave is input are individually detected and differentially amplified. In the conventional technique, it is necessary to convert the current signal into a voltage taking into account the offset current. When the offset current is large, the current-to-voltage conversion ratio needs to be set within a limited range so that no saturation occurs at the output of the current detection unit 104. This causes the apparatus to have a great limitation on the signal-to-noise ratio compared with the present embodiment of the invention. On the other hand, in the present embodiment of the invention, unlike the conventional technique in which the signal treated in the signal detection process includes the offset current, the offset current has already been suppressed when the signal detection process is performed.

FIG. 1 is a diagram illustrating an example of a configuration of a terahertz time-domain waveform measurement apparatus according to an embodiment of the invention. In the configuration shown in FIG. 1, the terahertz time-domain waveform measurement apparatus includes a generating unit 101, a sensor unit 102, an optical delay unit 103, a current detection unit 104, a processing unit 105, a bias applying unit 106, and a light source 110. In addition, the apparatus includes a part (e.g., circuit) that corrects the offset current (an offset current correcting unit). This part includes a current drawing unit 107, an adjustment unit 108, and a switching unit 109.

The generating unit 101 is a device or circuit that generates a terahertz wave. In the generating unit 101, the terahertz wave may be generated by a method using an instantaneous current or a method using interband transition of carriers. In the method using the instantaneous current, the terahertz wave may be generated using a technique of illuminating a surface of a semiconductor or an organic crystal with excitation light. In this technique, the illuminating of the excitation light may be performed while applying an electric field to a device (photoconductive device) having a metal antennal pattern formed on a thin semiconductor film. Alternatively, a positive-intrinsic-negative (PIN) diode may be used. On the other hand, in the method using the interband transition of carries in the gain structure, a semiconductor quantum well structure may be used. Although these are two simple examples, it is expected that a person having ordinary skill in the art would be familiar with these and other conventional structures useful for terahertz-wave generation.

The sensor unit 102 may be implemented by a known sensor (e.g., semiconductor or otherwise) that detects the electric field intensity of the terahertz wave. In the sensor unit 102, the electric field intensity of the terahertz wave may be sensed by detecting a current that is generated in response to a change in photoconductivity caused by illumination of the excitation light. In this technique, a photoconductive device of any known type may be used to detect the current caused by a change in photoconductivity. Specifically, in a photoconductive detector, an electric potential is applied across an optically absorbing region to cause a current to flow in proportion to the irradiance of photons incident on the absorbing region. Depending on the spectral responsivity of the absorbing region, photoconductive detectors for visible, near infrared and infrared wavelengths can be used.

In the present embodiment, the light source 110 may be implemented by an ultrafast laser that outputs ultrashort pulses of laser light. The above-described generating unit 101 and the sensor unit 102 are configured to operate by irradiating a thin semiconductor film with the ultrashort pulse laser light to excite carries in the thin semiconductor film. In the present description, in view of the above, the ultrashort pulse laser light is also referred to as excitation light. As shown in FIG. 1, the excitation light generated by light source 110 is split into two optical paths L1 and L2. The excitation light travelling along the optical path L1 illuminates the generating unit 101, while the excitation light travelling along the optical path L2 illuminates the sensor unit 102 via the optical delay unit 103.

The optical delay unit 103 is configured to adjust the delay time between a time at which the terahertz wave is generated by the generating unit 101 and a time at which the terahertz wave is detected by the sensor unit 102 to adjust sampling points at which data is acquired to produce the time-domain waveform of the terahertz wave. More specifically, the time for the excitation light to arrive at the sensor unit 102 is delayed with respect to the time for the excitation light to arrive at the generating unit 101. The difference in arrival time of the excitation light between the generating unit 101 and the sensor unit 102 may be controlled by directly adjusting the length of the optical propagation path of the excitation light or by adjusting the effective length of the optical path. A specific method of the direct adjustment of the optical path length is to use a folded optical system in which the excitation light is reflected back to travel an extra distance. The length of the optical path is adjusted by moving this folded optical system in the same direction as the folded direction of the optical path by using a moving part. A specific method of adjusting the effective length of the optical path is to change a time constant (refractive index) in the optical path along which the excitation light travels. In the example shown in FIG. 1, a one-stage folded optical system and a linear motion stage serving as a moving part are used. The length of the optical path L2 from the laser light source 110 to the sensor unit 102 is changed by changing the position of the folded optical system by using the moving part. The change in the optical path length is controlled in a manner that the difference (L2−L1) in optical path length produces a particular time difference between a time at which the excitation light reaches the generating unit 101 and a time at which the excitation light reaches the sensor unit 102. If the driving speed of the moving part is high, the time-domain waveform of the terahertz wave can be acquired in a short time.

The bias applying unit 106 is a unit that provides a bias voltage to drive the generating unit 101. In a case where a photoconductive device is used as the generating unit 101, a voltage is applied to a metal electrode including an antenna pattern. In particular, when the current detection unit 104 (described later) includes a lockin detection system, the voltage supplied by the bias applying unit 106 is modulated by a frequency equal to that of a reference signal in the lockin detection system. In the lockin detection technique, instead of modulating the bias voltage supplied by the bias applying unit 106, the modulation may be achieved by modulating the excitation light using an optical chopper. In the latter method, the bias applying unit 106 applies a DC bias directly to the photoconductive device.

The current detection unit 104 is a circuit that converts a current signal into a voltage signal with a measurable level. When a photoconductive device is used as the sensor unit 102, the current detection unit 104 converts a current signal output from the sensor unit 102 into a voltage signal. The conversion ratio of the current signal to the voltage signal is referred to as a current-to-voltage conversion ratio. The current-to-voltage conversion ratio is selected within a range that allows the current detection unit 104 to provide an output corresponding to the current signal input to the current detection unit 104 without causing the output of the current detection unit 104 to exceed a rated value specified for the circuit and without causing saturation. To increase the signal-to-noise ratio of the measurement apparatus, the current-to-voltage conversion ratio may be set to be as large as possible. As described above, when the signal output from the sensor unit 102 is weak, the current detection unit 104 may include a lockin detection system. More specifically, the lockin detection system is disposed at a final stage of a circuit that performs the current-to-voltage conversion. In the case where the current detection unit 104 includes the lockin detection system, the circuit that performs the current-to-voltage conversion is set such that the amplitude of the signal output therefrom does not exceed the input rating of the lockin detection system.

The processing unit 105 is a processing device, such as a spectrum analyzer or a personal computer, that provides measurement data by producing the time-domain waveform of the terahertz wave. The time-domain waveform is produced based on the amount of change in the optical path length of the optical delay unit 103 and the output of the current detection unit 104. More specifically, the time-domain waveform is produced by plotting the output of the current detection unit 104 in steps of predetermined amount of change in the optical path length. The predetermined amount of change in the optical path length corresponds to a time interval t of the measurement data. The measurement data is obtained in the form of a series of intensity data plotted at time intervals t, and the obtained measurement data is stored. To improve the signal-to-noise ratio of the measurement apparatus, the linear motion stage of the optical delay unit 103 may be stopped at each measurement point (or the speed may be reduced to a level that can be regarded as being substantially at rest), and outputs provided by the current detection unit 104 to the processing unit 105 are averaged to obtain a final time-domain waveform. This technique is referred to as a step-and-scan method. An alternative technique is to acquire the time-domain waveform a plurality of times while driving the linear motion stage of the optical delay unit 103 at high speed. The acquired time-domain waveforms are averaged by the processing unit 105 for respective elements of the sequence of measured intensity data. This technique is referred to as a rapid scan method.

To output spectrum data in the frequency domain, the processing unit 105 reads the measurement data and performs a Fourier transform on the time-domain waveform of the terahertz wave to acquire the spectrum data. When the THz-TDS apparatus is used as an analysis apparatus, a sample (specimen) is irradiated with a terahertz wave and a change in time-domain waveform of the terahertz wave caused by the irradiation is determined. More specifically, the specimen (SAMPLE in FIG. 1) is irradiated with the terahertz wave generated by the generating unit 101, and the terahertz wave passing through the specimen or the terahertz wave reflected from the specimen is detected by the sensor unit 102. Based on the obtained time-domain waveform, information on the specimen is acquired. The processing unit 105 may acquire an image of the sample by monitoring a relative position between the sample and the terahertz wave irradiating the sample. With the configuration described above, the THz-TDS apparatus monitors a change in optical path length of excitation light provided by the optical delay unit 103 and a corresponding change in output of the current detection unit 104, and the THz-TDS apparatus produces a time-domain waveform of the terahertz wave irradiating the sensor unit 102.

In the present embodiment of the invention, the measuring apparatus further includes a part that corrects the offset current output from the sensor unit 102.

The correction of the offset current is performed such that the baseline of the time-domain waveform of the terahertz wave is set to be approximately the same as or closest to the reference potential of the measuring apparatus. More specifically, the reference potential of the measuring apparatus is given by the reference potential of the circuit forming the current detection unit 104. In FIG. 2A, this reference potential is denoted by COM. The baseline is corrected such that it is approximately the same as the reference potential, and, as shown in FIG. 4B, the change in the electric field of the terahertz wave irradiating the sensor unit 102 is produced by the processing unit 105 with respect to the baseline. In the present embodiment of the invention, the correction of the baseline is achieved by suppressing the offset current. The magnitude of the offset current to be suppressed is determined based on a value monitored during a period in which the measuring apparatus is in a waiting state. The waiting state of the measuring apparatus refers to a state in which the measuring apparatus does not perform the measurement of the terahertz time-domain waveform. For example, the waiting state may include a preparation period before the measurement is started, or the waiting state may be a particular period intentionally allowed after the preparation period, but before beginning actual measurement. The reason for which the baseline correction is performed in the waiting state is that if the baseline is changed during the measurement of the terahertz time-domain waveform, then this can cause the time-domain waveform of the terahertz wave to include a signal having no relation to the change in electric field of the terahertz wave irradiating the sensor unit 102. That is, to avoid detecting a signal having no relation to the change in electric field of the terahertz wave, the baseline correction is performed in the waiting state.

Figure 2B:
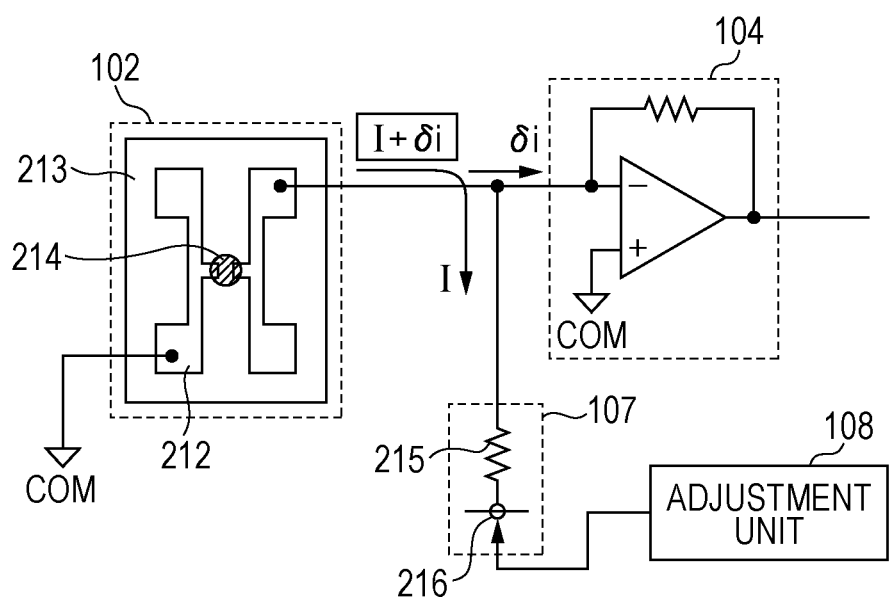
FIG. 2B is a diagram illustrating an example of a configuration associated with a current drawing unit.
Figure 3:
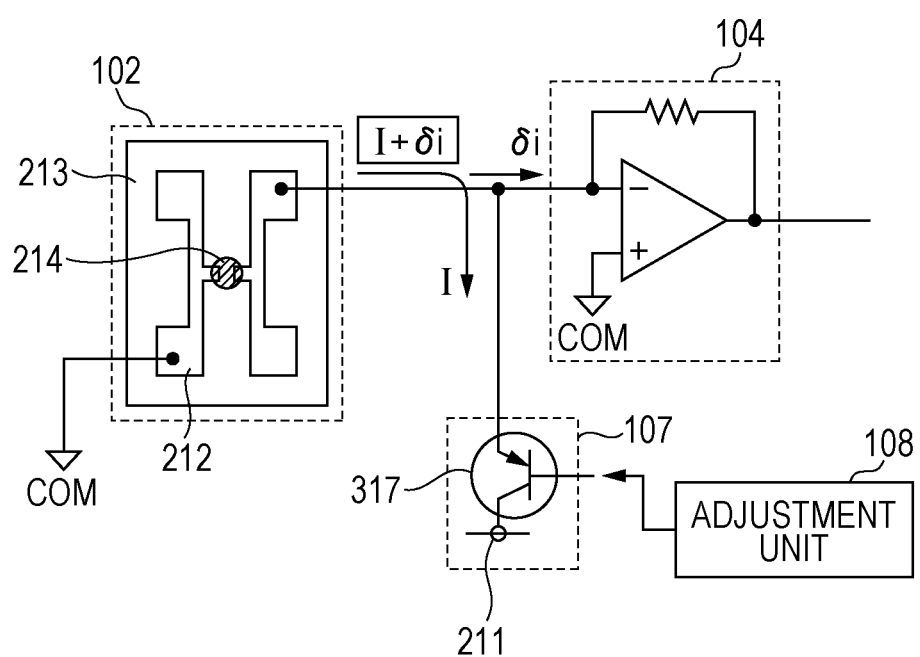
FIG. 3 is a diagram illustrating an example of a configuration associated with a current drawing unit.

The part that performs the correction of the offset current is now described in further detail. As noted above, the offset current correction part includes the current drawing unit 107, the adjustment unit 108, and the switching unit 109. FIG. 2A, FIG. 2B, and FIG. 3 illustrates examples of configurations of the current drawing unit 107 and the adjustment unit 108. The current drawing unit 107 may be implemented either as a physical circuit or a logical construct (hardware, software or combination of both) that draws a current from the sensor unit 102 with a magnitude corresponding to that of the offset current. The adjustment unit 108 is a unit that adjusts the magnitude of the current drawn. To realize the function of adjusting the magnitude of the current drawn, the adjustment unit 108 also has a function of monitoring the output of the current detection unit 104. FIG. 2A illustrates an example of a configuration in which the current drawing unit 107 is realized using a variable resistance unit 210 and a bias applying unit 211. FIG. 2B illustrates an example of a configuration in which the current drawing unit 107 is realized using a resistor 215 and a bias adjustment unit 216. In the configuration shown in FIG. 2A, the magnitude of the current flowing through the resistor (variable resistance unit 210) is adjusted by the adjustment unit 108 by moving a contact connected to the adjustment unit 108 along the variable resistance unit 210 thereby changing the resistance. In the configuration shown in FIG. 2B, in contrast, the magnitude of the current flowing through the resistor (resistor 215) is adjusted by the adjustment unit 108 by changing the bias applied to the bias adjustment unit 216 of the resistor. In the example shown in FIG. 3, the current drawing unit 107 is realized using a current sink circuit 317 and a bias applying unit 211. The current sink circuit 317 is realized using a semiconductor device such as a transistor. In this configuration, the adjustment unit 108 adjusts the magnitude of the current drawn by the current drawing unit 107 by changing the bias condition (such as a bias voltage or a bias current) of the semiconductor device. In the configurations described above, when the offset current is determined, a loop is formed among the adjustment unit 108, the current detection unit 104, and the current drawing unit 107 whereby the output of the current detection unit 104 is monitored. That is, the monitoring and the adjusting of the offset current in the adjustment process are performed such that a loop is formed between the voltage detection and the current drawing during the waiting state, and the magnitude of the drawing current is determined such that the voltage signal detected in the voltage detection process becomes approximately equal to the reference potential in the voltage detection process. By forming the signal loop in the above-described manner, it becomes possible to precisely determine the offset current and thus it becomes possible to precisely correct the measurement.

As described above, in the configurations shown in FIGS. 2A, 2B and 3, the sensor unit 102 is realized using a photoconductive device. More specifically, the sensor unit 102 is configured using a photoconductive film 213 and an antenna electrode 212. The photoconductive film 213 generates carriers in response to excitation light irradiating the photoconductive film 213, and carries are output as a current δi corresponding to a change in electric field of a terahertz wave. The process described above occurs in a part (excitation light irradiation region 214) including a small gap in the antenna electrode 212. Actually, in addition to the current δi corresponding to the change in electric field of the terahertz wave (hereinafter, this current will be referred to as a terahertz-wave current), the current output from the sensor unit 102 also includes a current I nearly corresponding to a DC component generated by the irradiation of the excitation light. The current I is the offset current, and the terahertz-wave current δi changes in magnitude around the current I, i.e., the current output from the sensor unit 102 is I+δi.

For example, in a case where low-temperature grown gallium arsenide (LT-GaAs) is used as the photoconductive film 213, the offset current I is generally on the order of a few nano-amperes (nA) and the terahertz-wave current δi is generally on the order of a few hundred nA. In such a situation, the terahertz-wave current is much larger in magnitude than the offset current, and thus the current-to-voltage conversion ratio of the current detection unit 104 may be set simply based on the terahertz-wave current. That is, the offset current does not have a significant effect. However, in a case where low-temperature grown indium gallium arsenide (LT-InGaAs) is used as the photoconductive film 213, the offset current I can be as large as the order of a few hundred micro-amperes (μA) while the terahertz-wave current δi is generally on the order of a few hundred nA. In this case, the terahertz-wave current is 5 orders of magnitude smaller than the offset current, and thus, to ensure that the circuit operates without going beyond the rating for which it is constructed, the maximum allowable current-to-voltage conversion ratio of the current detection unit 104 is limited by the offset current. As a result, the current-to-voltage conversion ratio for the terahertz-wave current is limited to a small value and thus the signal-to-noise ratio of the measuring apparatus is limited. In this situation, it is important to subtract the offset current I from the output of the sensor unit 102 so that the current detection unit 104 can employ a large value as the current-to-voltage conversion ratio for the terahertz-wave current δi. Note that the values of the offset current I and the terahertz-wave current δi can vary depending on various factors or conditions such as characteristics of photoconductive film and the intensity of the excitation light.

Referring again to FIG. 1, the switching unit 109 is disposed in a signal path from the current detection unit 104 to the adjustment unit 108. When the measuring apparatus is in the waiting state, the switching unit 109 connects the current detection unit 104 to the adjustment unit 108, and the adjustment unit 108 monitors the output of the current detection unit 104. When the measuring apparatus measures the time-domain waveform of the terahertz wave, the switching unit 109 disconnects the adjustment unit 108 from the current detection unit 104. In this state, the adjustment unit 108 adjusts the magnitude of the current drawn by the current drawing unit 107 based on the result of the monitoring performed in the waiting state so that the offset current I output from the sensor unit 102 is drawn by the current drawing unit 107 and only the terahertz-wave current δi is input to the current detection unit 104. In the present embodiment of the invention, the process of subtracting the current in the above-described manner is referred to as a correction; and the state in which the correction occurs is referred to as a correcting (corrected) state. In the present embodiment of the invention, the measuring apparatus measures the terahertz time-domain waveform in the corrected state.

In the above-described manner, the terahertz time-domain waveform measuring apparatus corrects the time-domain waveform by suppressing the offset current. This makes it possible to configure the current detection unit 104 to have a greater detection sensitivity (e.g., a greater current-to-voltage conversion ratio), which leads to an increase in the signal-to-noise ratio of the measuring apparatus. Note that in the present embodiment, the measuring apparatus makes the correction not by continuously measuring the offset current but based on the magnitude of the offset current determined in advance during the waiting state. In this technique, a change in baseline of the terahertz time-domain waveform does not occur during the process of measuring and producing the time-domain waveform, and thus it is possible to prevent intrusion of a spurious signal having no relation to the terahertz wave striking the sensor unit 102. As a result, it is possible to achieve an improvement in reliability of the measurement. Furthermore, it becomes possible to set the current detection unit 104 to have a high current-to-voltage conversion ratio, which makes it possible to obtain a signal with a high intensity. This makes it possible to build an apparatus having no lockin detection system that is generally used in conventional apparatuses, which allows a reduction in the apparatus size. In other words, by determining the offset current during the waiting state and suppressing the offset current I from the actual terahertz-wave current δi during the correcting state, a time-domain measurement apparatus without lock-in detection can be achieved.

Next, more specific embodiments of the measurement apparatus and the measurement method are described below.

First Embodiment

A first embodiment is described. In the following description, similar parts to those described above are not explained again to avoid unnecessary repetition. The measurement technique according to the present embodiment is applicable to both the step-and-scan method and the rapid scan method. In the present embodiment, the waiting state is provided in a preparation period before the measurement is started. More specifically, the waiting state refers to a state immediately before the measurement of the terahertz wave is started. In the waiting state, the measuring apparatus waits for a measurement start trigger to be issued. In the present embodiment, in this waiting state, the optical delay unit 103 adjusts the length of the optical path of excitation light such that the excitation light traveling on the optical path L2 arrives at the sensor unit 102 before the terahertz wave pulse arrives at the sensor unit 102. That is, in the waiting state, a baseline correction of the measuring apparatus is performed in a state in which the terahertz wave can be regarded as substantially being cut off.

Figure 4A:
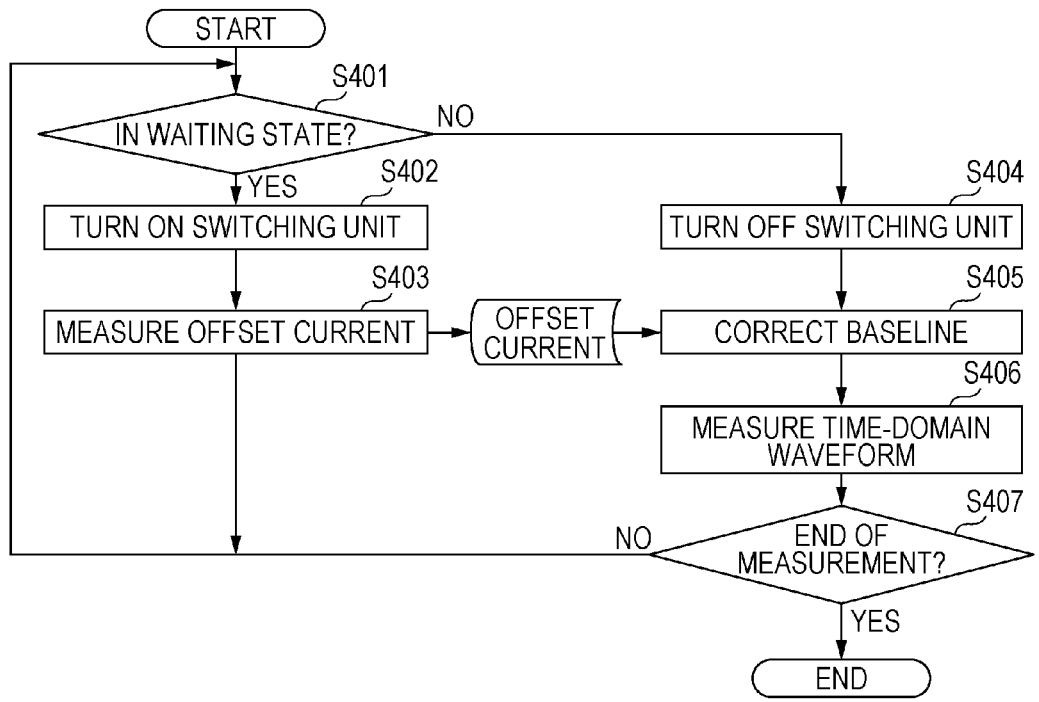
FIG. 4A is a flow chart illustrating a measurement process according to an embodiment.
Figure 4B:
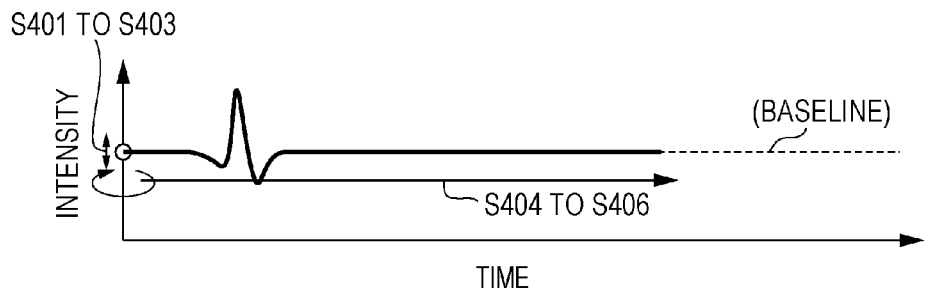
FIG. 4B is a diagram illustrating a concept of a measurement process according to an embodiment.

FIG. 4A is a flow chart illustrating a measurement process according to the present embodiment. FIG. 4B illustrates the time-domain concept of the operation of detecting the time-domain terahertz waveform. Referring to these figures and also FIG. 1 as required, the operation flow according to the present embodiment is described below. Referring to FIG. 4A, after initiating (START) a desired measurement routine, the measuring apparatus determines whether it is in the waiting state (step S401). As described above, in the waiting state, the measuring apparatus waits for a trigger to be issued to start the measurement. In a case where the measuring apparatus is in the waiting state (YES in step S401), the measuring apparatus activates (e.g., turns ON) the switching unit 109 at step S402. As a result, the switching unit 109 connects the current detection unit 104 to the adjustment unit 108. This makes it possible for the adjustment unit 108 to monitor the output of the current detection unit 104. At step S403, when the switching unit 109 is in the active state (ON state), the adjustment unit 108 measures the offset current based on the output of the current detection unit 104 and stores the value (amount) of the measured offset current. The adjustment unit 108 adjusts the magnitude of the current drawn by the current drawing unit 107 such that the offset current is eliminated from the levels of current detected by the current detection unit 104. In other words, it can be said that adjustment unit 108 causes the drawing unit 107 to draw the offset current until no offset current is detected by the current detection unit 104.

More specifically, the magnitude of the drawn current is adjusted such that the output of the current detection unit 104 is approximately equal to the reference potential of the measuring apparatus. The adjustment unit 108 includes a sample-and-hold circuit or a storage unit similar to the sample-and-hold circuit to store the adjustment value. The sequence of the processing steps S401 to S403 described above is performed repeatedly as long as the measuring apparatus is in the waiting state. Referring to FIG. 4B illustrating the concept of the operation, at the beginning of a terahertz time-domain waveform, the measuring apparatus suppresses the offset current and seeks the baseline. Note that this process does not necessarily need to be performed at the beginning of the terahertz time-domain waveform. The measuring apparatus may be set such that the seeking of the baseline by the optical delay unit 103 is performed at a position different from that where the measurement is started.

If the measuring apparatus detects a trigger that causes the measurement to start (NO in step S401), the measuring apparatus is no longer in the waiting state and deactivates (turns off) the switching unit 109 (step S404). As a result, the switching unit 109 disconnects the adjustment unit 108 from the current detection unit 104. This causes the adjustment unit 108 to stop monitoring the output of the current detection unit 104. At step S405, when the switching unit 109 is in the deactivated state (OFF state), the adjustment unit 108 adjusts the current drawn by the current drawing unit 107 with respect to (using) the magnitude of the offset current detected and stored in step S403 during the waiting state. Thus, the correction is performed in terms of the baseline. In this corrected state (step S406), the measuring apparatus measures the terahertz time-domain waveform. In this processing step, the current detection unit 104 detects the terahertz-wave current including no offset current because the offset current has already been subtracted. As can be seen from FIG. 4B illustrating the concept of the operation, after the baseline correction is performed, the measuring apparatus performs the measurement of the time-domain waveform while maintaining the baseline in the corrected state. In a case where a plurality of time-domain waveforms are measured as in the case of measurement using the rapid scan technique, the measuring apparatus returns the processing flow to step S401. The correction for the plurality of time-domain waveforms may be performed for each time-domain waveform or for each group of time-domain waveforms (each group may include, for example, 10 time-domain waveforms). If the last measurement is completed, the measurement operation is ended (step S407).

Second Embodiment

A second embodiment is based on the first embodiment described above, but the operation flow according to the first embodiment is modified such that the operation flow includes an additional step of cutting off the terahertz wave in the waiting state. A description of similar processing steps to those described above is omitted in the following explanation. In the present embodiment, the waiting state is intentionally provided such that it is inserted in an operation of measuring the time-domain waveform. When the waiting state is intentionally inserted, the terahertz wave applied to the sensor unit 102 is cut off, and the measurement correction is performed in this state in which no terahertz wave reaches the sensor unit 102. Note that the method of cutting off the terahertz wave such that it does not reach the sensor unit 102 during the waiting state may be employed in other embodiments as well.

Figure 5A:
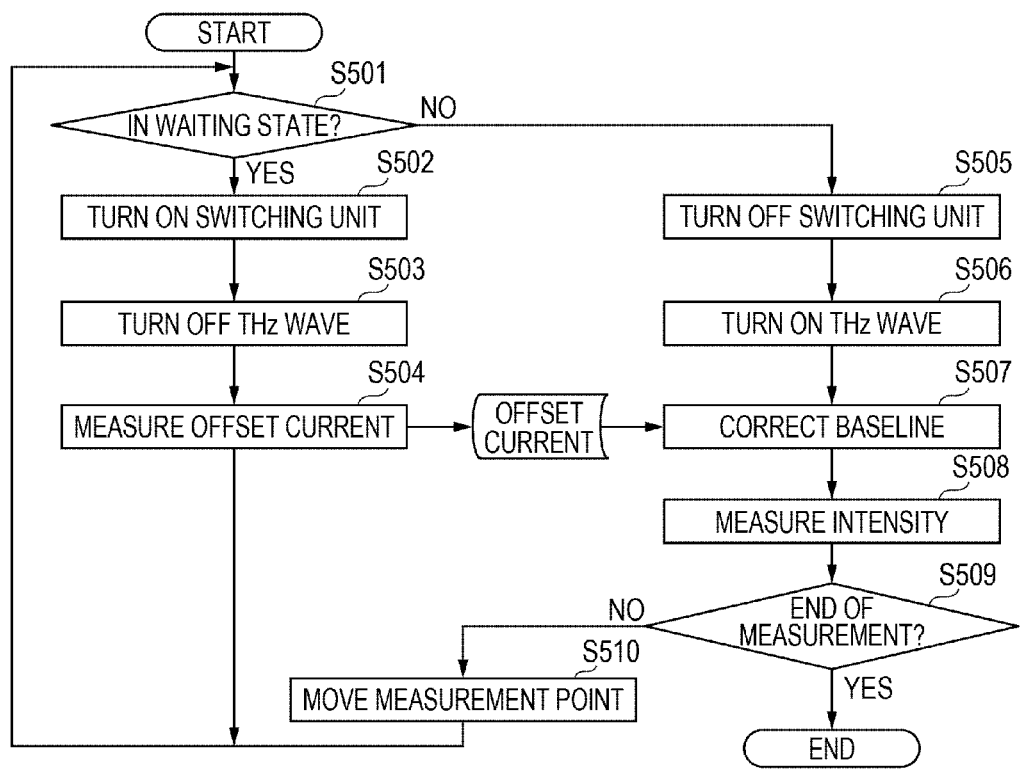
FIG. 5A is a flow chart illustrating a measurement process according to an embodiment.
Figure 5B:
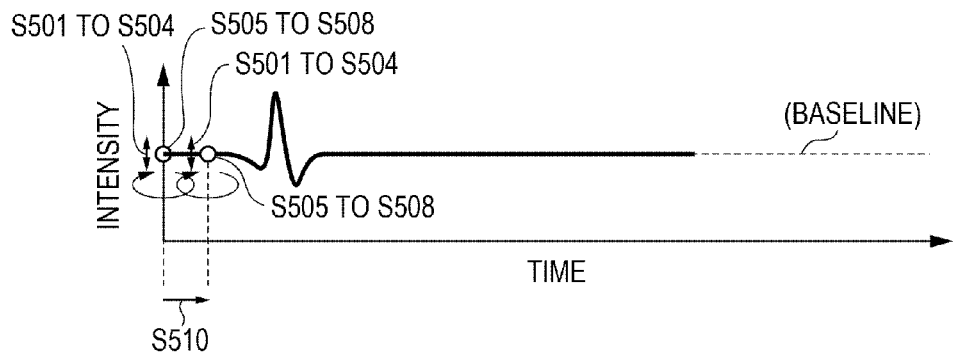
FIG. 5B is a diagram illustrating a concept of a measurement process according to an embodiment.

FIG. 5A is a flow chart illustrating a measurement process according to the second embodiment. FIG. 5B illustrates the concept of the operation. Referring to these figures and also FIG. 1 as required, the operation flow according to the present embodiment is described below. In FIG. 5A, the measuring apparatus determines whether it is in a waiting state (S501). In a case where the measuring apparatus is in the waiting state (YES in step S501), the measuring apparatus turns on the switching unit 109 (step S502). When the switching unit 109 is in the ON state, the measuring apparatus turns off the terahertz wave such that the sensor unit 102 is not irradiated by the terahertz wave. In the present embodiment, the measuring apparatus controls the generating unit 101 via the bias applying unit 106 not to generate the terahertz wave. Alternatively, any other method may be used as long as the method allows the terahertz wave to be cut off such that it does not reach the sensor unit 102. For example, a mechanism for physically blocking the terahertz wave may be disposed in a propagation path of the terahertz wave. Alternatively, a mechanism may be used to turn off the excitation light traveling on the optical path L1 irradiating the generating unit 101. Thereafter, the adjustment unit 108 measures and stores the offset current and adjusts the magnitude of the current drawn by the current drawing unit 107 (step S504).

If the measuring apparatus detects a trigger that causes the measurement to start (NO in step S501), the measuring apparatus turns off the switching unit 109 (step S505) thereby releasing the terahertz wave from the cut-off state (step S506). In this state, the measuring apparatus performs the baseline correction (step S507). The measuring apparatus then plots the output of the current detection unit 104 against the change in the optical path length produced by the optical delay unit 103 (step S508). In a case where it is determined that the production of the time-domain waveform is not yet complete (NO in step S509) for a predetermined length of time period or in a case where it is determined that a further measurement of the time-domain waveform is necessary (step S509), the measuring apparatus moves the measurement point by controlling the optical delay unit 103 (step S510). Thereafter, the measuring apparatus returns the processing flow to step S501. If the last measurement is completed (YES in step S509), the measurement operation is ended.

As can be seen from FIG. 5B illustrating the concept of the operation, the measuring apparatus performs the baseline correction for each measurement point, and, while maintaining the corrected baseline, the measuring apparatus performs the measurement of the time-domain waveform. Note that instead of performing the baseline correction for each measurement point, the baseline correction may be performed once every predetermined number of measurement points (for example, once every ten measurement points). The present embodiment may be applied to both the step-and-scan method and the rapid scan method. The present embodiment may be more useful when it is applied to the step-and-scan method.

In the measurement according to the present embodiment, as described above, the terahertz wave is cut off such that it does not reach the sensor unit 102 during the process of determining the offset current. This provides, in addition to the advantages provided by the first embodiment, an advantage that it is ensured that the output of the current detection unit 104 is prevented from being affected by the electric field of the terahertz wave and thus an increase in measurement accuracy of the offset current is achieved.

Third Embodiment

A third embodiment disclosed below is also based on the first embodiment, but the operation flow according to the first embodiment is modified such that the waiting state is provided in a different manner. A description of similar processing steps to those described above is omitted in the following explanation. In the present embodiment, the waiting state is provided in a preparation period before the measurement is started. More specifically, the waiting state is provided in a period from a time at which measurement of a first time-domain waveform by the optical delay unit 103 is ended to a time at which measurement of a second time-domain waveform is started. In the present embodiment, the correction of the measuring apparatus is performed based on the signal output from the current detection unit 104 during this period.

Figure 6A:
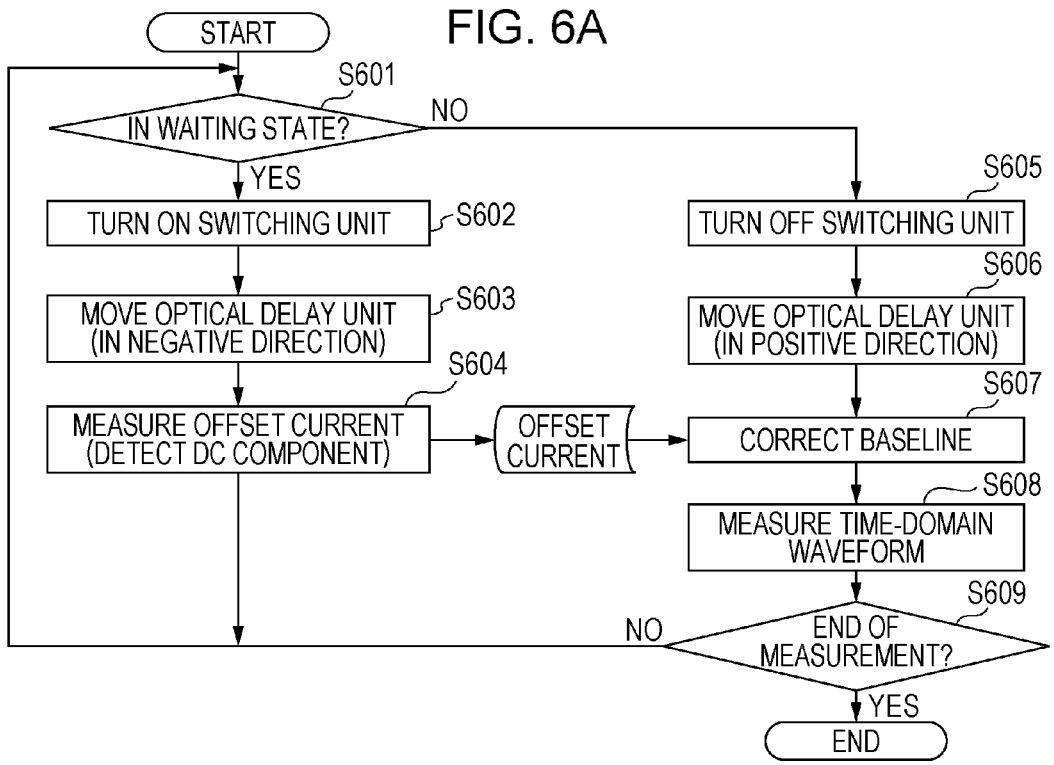
FIG. 6A is a flow chart illustrating a measurement process according to an embodiment.
Figure 6B:
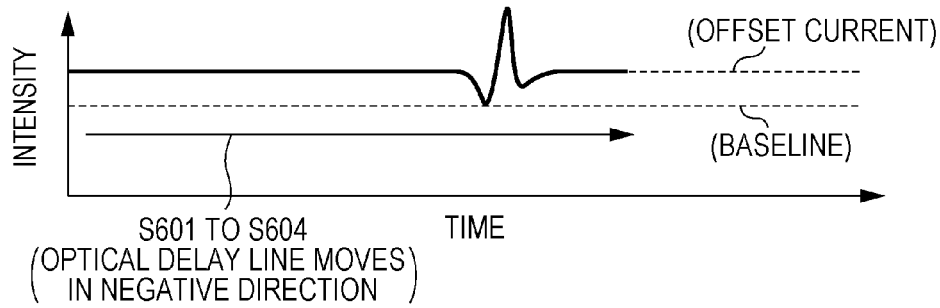
FIG. 6B is a diagram illustrating a concept of an operation of determining an offset current by a measuring apparatus according to an embodiment.
Figure 6C:
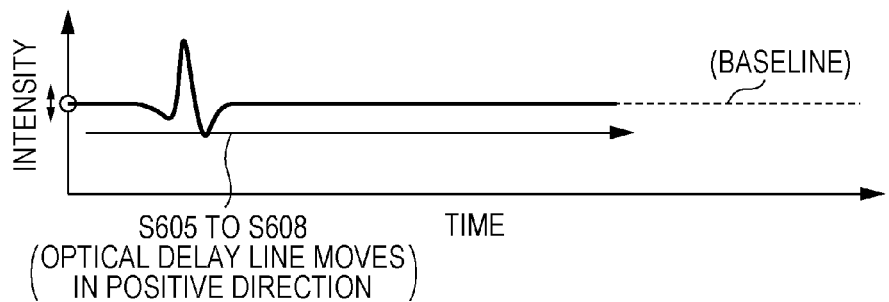
FIG. 6C is a diagram illustrating a concept of an operation of measuring a time-domain waveform by a measuring apparatus according to an embodiment.

FIG. 6A is a flow chart illustrating a measurement process according to the third embodiment. FIG. 6B is a diagram illustrating a concept of an operation of determining an offset current by the measuring apparatus according to the present embodiment. FIG. 6C is a diagram illustrating a concept of an operation of measuring a time-domain waveform by the measuring apparatus according to the present embodiment. In FIGS. 6A to 6C, a direction in which the optical delay unit 103 moves during the process of measuring the time-domain waveform is defined as a positive direction, while a direction in which the optical delay unit 103 returns from a point at which the measurement of the time-domain waveform is ended to a point at which the measurement is started is defined as a negative direction. That is, in the present embodiment, information associated with the correction is acquired in a period in which the optical delay unit 103 moves in the negative direction.

Referring to FIG. 6A, the measuring apparatus determines whether it is in the waiting state (step S601). More specifically, in the present embodiment, a determination is made as to whether the optical delay unit 103 is at the end point or the start point of the time-domain waveform measurement. If the optical delay unit 103 is at the measurement end point, it is determined that the measuring apparatus is in the waiting state. In the case where the measuring apparatus is in the waiting state (YES in step S601), the measuring apparatus turns on the switching unit 109 (step S602). The measuring apparatus then drives the optical delay unit 103 in the negative direction (step S603). In the present embodiment, it is assumed that the optical delay unit 103 moves at the same speed in the positive and negative directions. When the optical delay unit 103 is being driven in the negative direction, the sensor unit 102 is irradiated by the terahertz wave and the excitation light traveling in the optical path L2 and thus current detection unit 104 outputs a signal such as that shown in FIG. 6B. In FIG. 6B, the detected waveform of the terahertz wave has an offset corresponding to an offset current with respect to the baseline. The adjustment unit 108 extracts a DC signal component from the signal described above via a low-pass filter thereby determining the offset current (step S604). The adjustment unit 108 determines the magnitude of the current drawn by the current drawing unit 107 such that the offset current is eliminated. In the period in which the optical delay unit 103 moves in the negative direction, the terahertz wave is cut off such that the sensor unit 102 is not irradiated by the terahertz wave as in the second embodiment described above.

When the optical delay unit 103 reaches the time-domain waveform measurement start point and the measuring apparatus detects a trigger that causes the measurement to start (NO in step S601), the measuring apparatus turns off the switching unit 109 (step S605). The measuring apparatus issues a command to drive the optical delay unit 103 in the positive direction (step S606). The magnitude of the current drawn by the current drawing unit 107 is adjusted based on the magnitude of the offset current determined in the waiting state (step S607). Thus, the baseline correction is achieved. In this state in which the baseline is corrected, the measuring apparatus measures the terahertz time-domain waveform (step S608). In this process, the current detection unit 104 detects the terahertz-wave current including no offset current because the offset current has already been subtracted. As can be seen from FIG. 6C illustrating the concept of the operation, after the baseline correction is performed, the measuring apparatus performs the measurement of the time-domain waveform while maintaining the baseline in the corrected state.

In the present embodiment, it is assumed that a plurality of time-domain waveforms are measured as in the measurement using the rapid scan method. When the optical delay unit 103 reaches the measurement end point, if a further time-domain waveform measurement is necessary (NO at step S609), the measuring apparatus returns the processing flow to step S601. Note that the present embodiment is not limited to the rapid scan method, but the present embodiment is also applicable to a measurement in which a plurality of time-domain waveforms are measured using the step-and-scan method. If the last measurement is completed, the measurement operation is ended (YES in step S609).

In the present embodiment, as described above, the signal output from the current detection unit 104 is monitored during a period in which the optical delay unit 103 moves from the time-domain waveform measurement end position to the time-domain waveform measurement start position, and the DC component is extracted from the output signal thereby determining the magnitude of the offset current. That is, the current detection process includes a process of adjusting the difference between the time at which the excitation light arrives at the generating unit and the time at which the excitation light arrives at the sensor unit by adjusting, using the optical delay unit, the length of the optical path L2 along which the excitation light travels. In the adjustment process, the apparatus is maintained in the waiting state during the period in which the optical delay unit moves from the measurement end point to the next measurement start point. The signal output as a result of the voltage signal detection is monitored during the waiting state and the magnitude of the drawn offset current is determined based on a DC component of the monitored signal. As described above, information necessary in the correction of the measuring apparatus is acquired in the period in which no operation directly relevant to the measurement of the time-domain waveform is performed, and thus an improvement in operation efficiency is achieved.

Fourth Embodiment

Figure 7A:
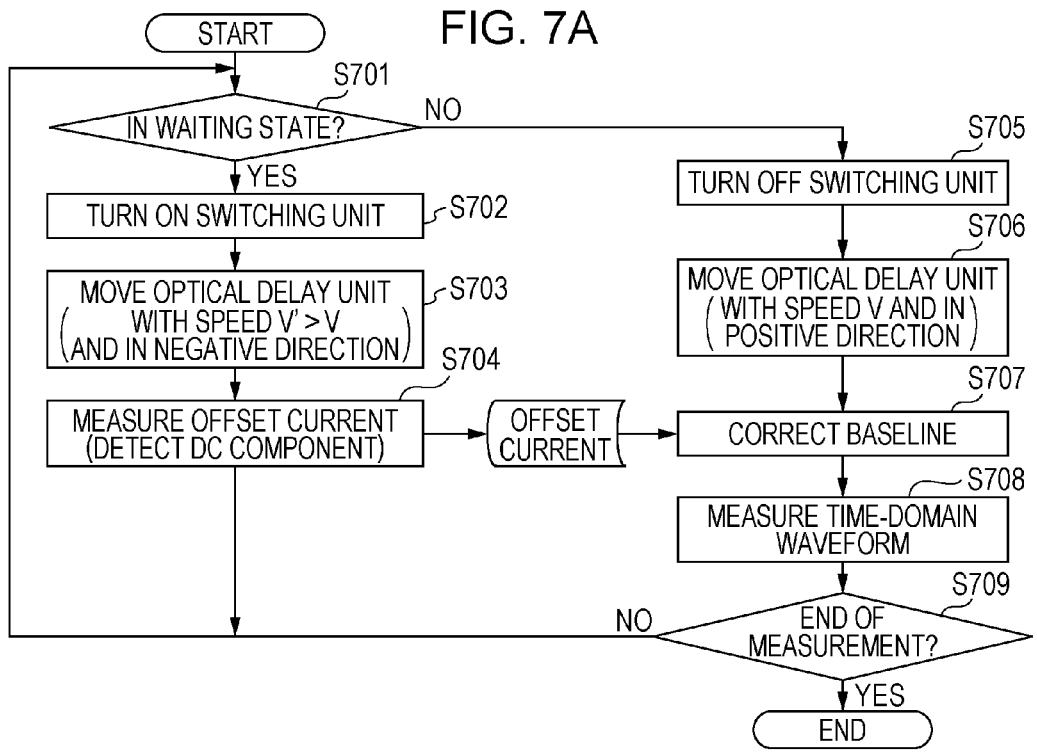
FIG. 7A is a flow chart illustrating a measurement process according to an embodiment.
Figure 7B:
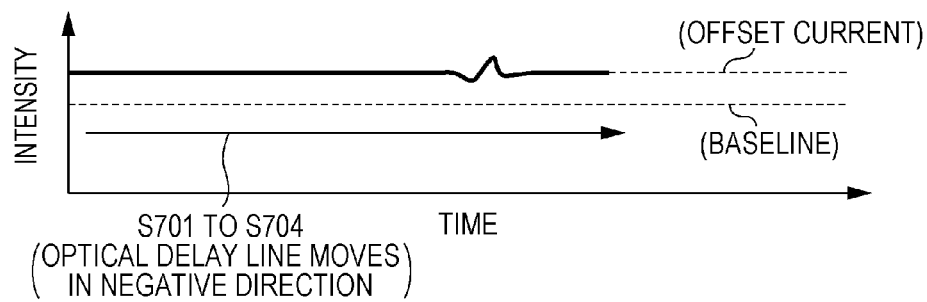
FIG. 7B is a diagram illustrating a concept of an operation of determining an offset current by a measuring apparatus according to an embodiment.
Figure 7C:
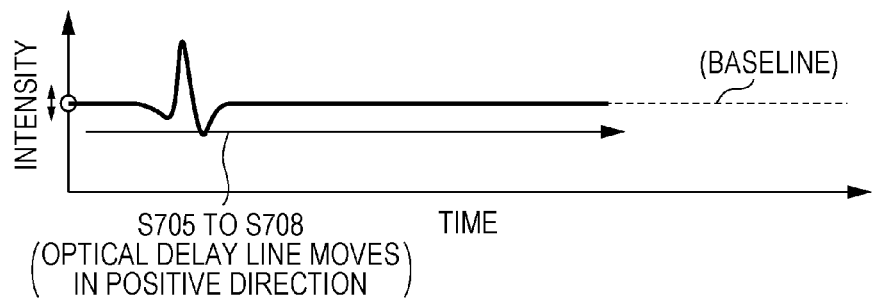
FIG. 7C is a diagram illustrating a concept of an operation of measuring a time-domain waveform by a measuring apparatus according to an embodiment.

A fourth embodiment is based on the third embodiment described above but the operation flow according to the third embodiment is modified such that the optical delay unit 103 is driven in the negative direction at a speed different from the speed at which the optical delay unit 103 is driven in the positive direction. In the following explanation, a description of processing steps similar to those described above is omitted. FIG. 7A is a flow chart illustrating a measurement process according to the fourth embodiment. FIG. 7B is a graph illustrating a concept of an operation of determining an offset current according to the present embodiment. FIG. 7C is a graph illustrating a concept of an operation of measuring a time-domain waveform by the measuring apparatus according to the present embodiment. In FIGS. 7A to 7C, positive and negative driving directions of the optical delay unit 103 are defined in the same manner as in the third embodiment described above. In FIGS. 7A to 7C, the optical delay unit 103 is driven in the positive direction at a speed of V and in the negative direction at a speed of V'.

In the present embodiment, except for steps S703 and S704, steps S701 through S709 are substantially similar to steps S601 through S609 described above in reference to FIG. 6A. Specifically, in a period in which the optical delay unit 103 is driven in the negative direction, the driving speed of the optical delay unit 103 is adjusted to V'>V so that the speed of change in the signal output from the sensor unit 102 is greater than a value corresponding to the time constant of the measuring apparatus (step S703). As a result, as shown in FIG. 7B, the signal output from the current detection unit 104 in the period in which the optical delay unit 103 moves in the negative direction is approximated by a DC signal. From this approximated signal, the measuring apparatus determines the offset current (step S704).

In the present embodiment, as described above, the output of the current detection unit 104 is approximated by a DC value by adjusting the moving speed of the optical delay unit 103 from the time-domain waveform measurement end point to the start point. That is, in the adjustment process, in the waiting state, the movement of the optical delay unit is controlled such that the speed of change in the output current signal detected in the current detection process is greater than the value corresponding to the time constant of the measuring apparatus. In this method, an additional special unit is not necessary to extract a DC component from the output of the current detection unit 104, and thus it is possible to simplify the apparatus and reduce the apparatus size.

Fifth Embodiment

Figure 8A:
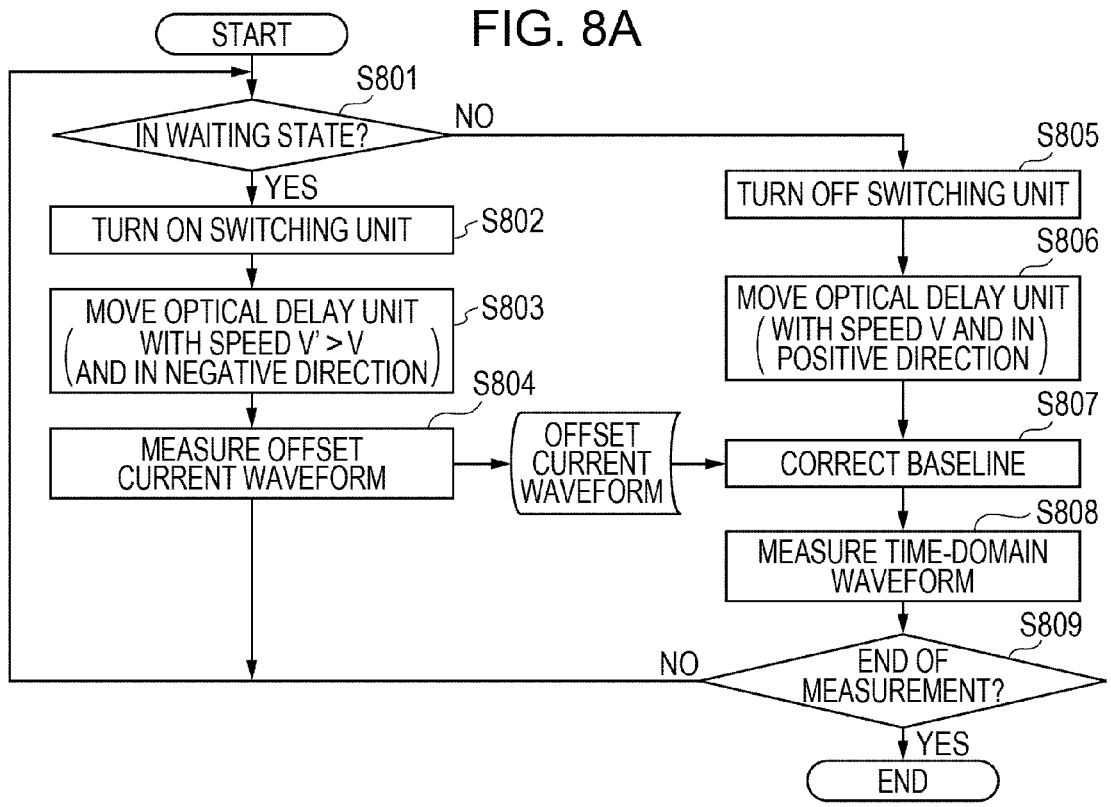
FIG. 8A is a flow chart illustrating a measurement process according to an embodiment.
Figure 8B:
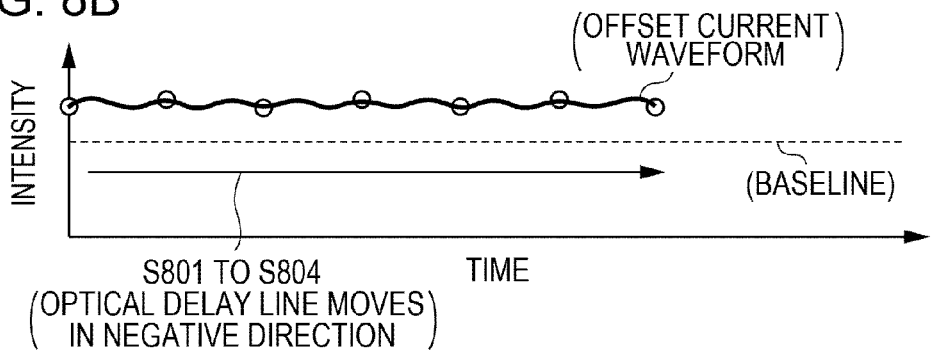
FIG. 8B is a diagram illustrating a concept of an operation of determining an offset current by a measuring apparatus according to an embodiment.
Figure 8C:
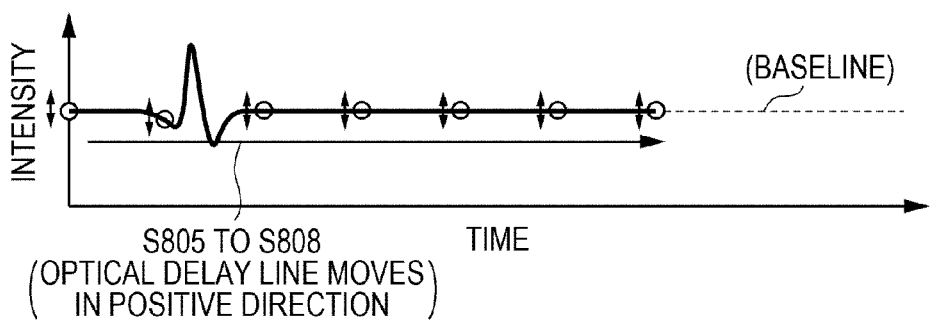
FIG. 8C is a diagram illustrating a concept of an operation of measuring a time-domain waveform by a measuring apparatus according to an embodiment.

A fifth embodiment disclosed below is also based on the third embodiment, but the operation flow according to the third embodiment is modified such that when the baseline correction is performed, a constant offset current is not referred to but an offset current waveform is referred to. Another difference is that the correction is performed for each measurement point of the time-domain waveform. A description of similar processing steps to those described above is omitted in the following explanation. FIG. 8A is a flow chart illustrating a measurement process according to the fifth embodiment. FIG. 8B is a diagram illustrating a concept of an operation of determining an offset current waveform by the measuring apparatus according to the present embodiment. FIG. 8C is a diagram illustrating a concept of an operation of measuring a time-domain waveform by the measuring apparatus according to the present embodiment. In FIGS. 8A to 8C, positive and negative driving directions of the optical delay unit 103 are defined in the same manner as in the third embodiment described above.

In the previous embodiments, the adjustment unit 108 determines the magnitude of the offset current by referring to the output of the current detection unit 104. In contrast, in the present embodiment, the adjustment unit 108 acquires an offset current waveform and the adjustment value of the optical path length of the optical delay unit 103 (step S804). In the present embodiment, as in the fourth embodiment described above, the moving speed of the optical delay unit 103 in the negative direction is adjusted such that the output of the current detection unit 104 becomes approximately equal to a DC value. Alternatively, the terahertz wave irradiating the sensor unit 102 may be cut off. Still alternatively, while the terahertz wave irradiating the sensor unit 102 is maintained in the cut-off state, the moving speed of the optical delay unit 103 in the negative direction may be adjusted. That is, any method may be used as long as the adjustment unit 108 can acquire a DC signal as an approximation of the offset current waveform. As can be seen from FIG. 8C illustrating the concept of the operation, the measuring apparatus refers to the offset current waveform described above and adjusts the correction value of the baseline depending on the adjustment point of the length of the optical path of the optical delay unit 103 thereby acquiring the time-domain waveform (steps S807 and S808).

In the present embodiment, the magnitude of the offset current is set or defined for each data element of a series of data of the time-domain waveform of the terahertz wave. That is, in the adjustment process, when the apparatus is in the waiting state, the offset current waveform is acquired based on the voltage signal detected in the voltage detection process, and the magnitude of the offset current is defined for each data element of the series of data of the time-domain waveform so that the magnitude of the drawn current can be adjusted for each data element. This makes it possible to perform a high-precision correction. Thus, it is possible to improve the measurement accuracy of the terahertz time-domain waveform formed by the series of data including a plurality of data elements.

Other Embodiments

The embodiments of the present invention may also be realized by performing processes as described below. That is, software (a program) for realizing the functions of the embodiment is supplied to a system or an apparatus via a network or a storage medium, and the program is read and executed by a computer (a CPU, a MPU, or the like) in the system or the apparatus. Note that any type of storage medium is usable as long as it is capable of storing the program in a form readable and executable by the computer whereby the method of measuring the terahertz wave can be practiced.

Example

Figure 9A:
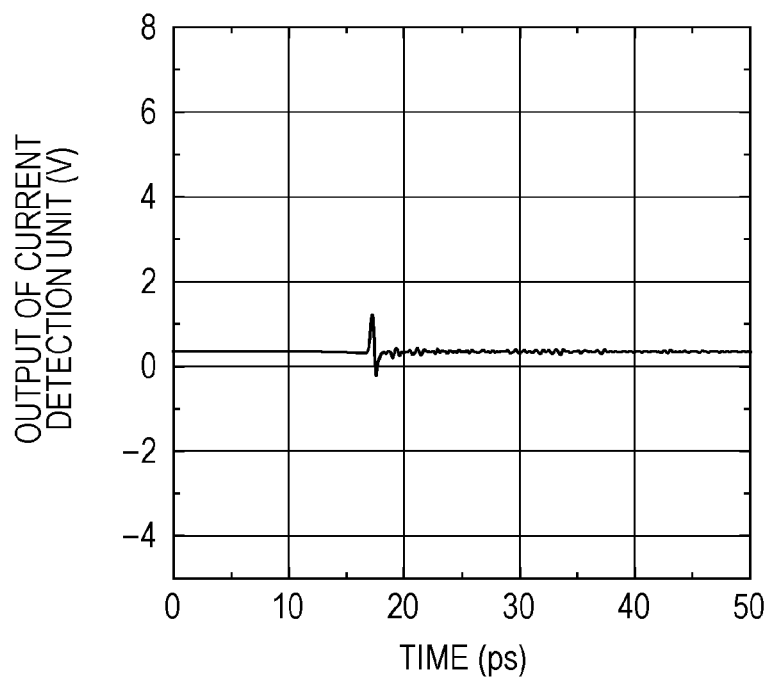
FIG. 9A is a plot of an output of a current detection unit for a case where a conventional apparatus is used in measurement.
Figure 9B:
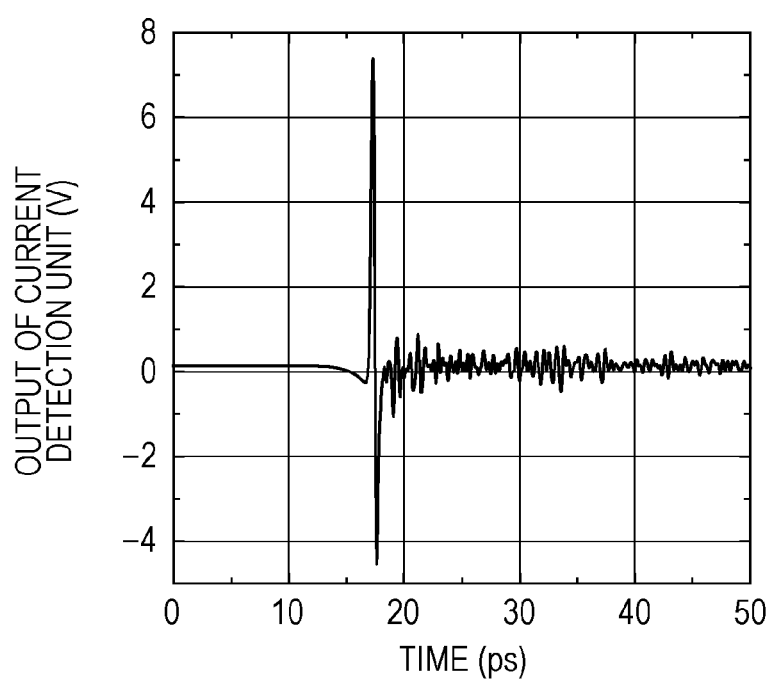
FIG. 9B is a plot of an output of a current detection unit for a case where an apparatus according to an embodiment is used in measurement.

A specific example of the first embodiment is described below. In the description of the example, similar parts to those described above are not explained again. In this example, the generating unit 101 and the detection unit 104 shown in FIG. 1 were each realized using a photoconductive device having the same device structure. More specifically, the photoconductive film 213 of the photoconductive device was realized by low-temperature grown gallium arsenide (LT-GaAs). Referring to FIG. 2B, the antenna electrode 212 was formed so as to include an antenna pattern with a length of 20 micrometers ($\mu$m) and a width of 10 $\mu$m and an electrode for an electric connection between the antenna pattern and an external circuit. The antenna pattern was formed so as to have a small gap of 6 $\mu$m. The electrode for the electric connection between the antenna pattern and the external circuit was formed so as to have a width of 5 $\mu$m. The optical delay unit 103 shown in FIG. 1 was realized using a one-stage folded optical system and a moving part. A retroreflector was used in the folded optical system. A linear motion stage with repeated positioning accuracy of ±20 nanometers (nm) was used as the moving part. The optical delay unit 103 was configured to include an encoder to monitor the position of the linear motion stage. In the present example of the embodiment of the invention, the apparatus refers to a signal output from the encoder to determine the difference in length between optical paths L1 and L2 of the excitation light. A current-voltage conversion amplifier such as that shown in FIG. 2B was used as the current detection unit 104. For the purpose of confirmation of the advantages of the embodiment of the invention, two values, 10 mega-ohms (M$\Omega$) and 100 M$\Omega$, were actually evaluated for the current-to-voltage conversion ratio of the amplifier. The output rating of the amplifier was ±10V. The processing unit 105 shown in FIG. 1 was configured to have an analog-to-digital converter board to monitor the output of the current detection unit 104 and position information output by the encoder disposed on the optical delay unit 103. The processing unit 105 also has a control board to control the units in the apparatus. The position of the optical delay unit 103 and the switching unit 109 were controlled by this control board. The switching unit 109 was controlled using a transistor-transistor-logic (TTL) signal such that when the apparatus was in the waiting state, an L-level signal was output, while an H-level signal is output when the apparatus is in a measuring state. The processing unit 105 included other parts including at least an arithmetic operation unit to control the boards and perform signal processing. A low-noise power supply was used as the bias applying unit 106 shown in FIG. 1. In the present example, a direct-current (DC) power supply was used for this purpose. Because the DC power supply was used as the bias applying unit 106, the apparatus directly acquired a terahertz wave signal without modulating it. The bias applying unit 106 was configured so as to apply a DC voltage of about 30 V to the generating unit 101. The current drawing unit 107 shown in FIG. 1 was configured using a resistor 215 and a bias adjustment unit 216 as shown in FIG. 2B. A fixed resistor was used as the resistor 215. In the present example, a resistor of 100 MΩ was used. The bias adjustment unit 216 was realized by a power supply capable of being externally controlled to adjust the apply voltage. Note that an analog signal or a digital signal may be used to adjust the apply voltage. In the present example, an analog signal was employed. In the present example, the bias applying unit 106 was configured to output a DC voltage, and the bias adjustment unit 216 was configured to apply the DC voltage to the resistor 215. As for the switching unit 109 shown in FIG. 1, an analog switch was used to electrically switch a signal line between the current detection unit 104 and the adjustment unit 108 in accordance with the TTL signal level provided by the processing unit 105. The adjustment unit 108 shown in FIG. 1 was configured so as to include a comparator to compare the output of the current detection unit 104 with a reference signal and an integration circuit to produce an adjustment signal based on a result of comparison performed by the comparator thereby controlling the bias adjustment unit 216. The position of the baseline of the time-domain waveform was determined according to the reference signal value. In the present example, to get the baseline of the time-domain waveform at 0 V, the reference signal was set to 0 V. The comparator outputted a signal corresponding to a difference between the output of the current detection unit 104 and the reference signal, and the integration circuit integrated the difference signal provided by the comparator. The above-described process was performed repeatedly during the waiting state whereby the baseline of the time-domain waveform was adjusted toward 0 V. The adjustment unit 108 also included a sample-and-hold circuit configured to hold the output of the integration circuit in accordance with an output from the switching unit 109. More specifically, the sample-and-hold circuit was configured to perform the sample-and-hold operation to hold the output value of the integration circuit when the output of the switching unit 109 was switched into an open state. During the measurement operation, the bias adjustment unit 216 adjusted the baseline of the time-domain waveform with respect to the value held by the sample-and-hold circuit. A titanium-sapphire laser was used as the light source 110 shown in FIG. 1. The titanium-sapphire laser used in this example emitted a laser pulse with a width of 50 femto seconds at a repetition frequency of 80 MHz. The excitation light with an intensity of 5 mW was applied to the generating unit 101, while the excitation light with an intensity of 0.5 mW was applied to the sensor unit 102. FIG. 9A is a plot of the output of the current detection unit 104 for the case where the conventional apparatus was used in the measurement. FIG. 9B is a plot of the output of the current detection unit 104 for the case where the measurement was performed using the apparatus according to the present example of an embodiment of the present invention. Under the measurement conditions described above, an offset current of about 5 µA was observed at the sensor unit 102 for the conventional apparatus. To ensure that the signal output from the current detection unit 104 did not exceed the rating of the amplifier, it was necessary to configure the current detection unit 104 so as to have a current-to-voltage conversion ratio of 10 MΩ. As a result, as can be seen from FIG. 9A, the signal output by the current detection unit 104 was limited in magnitude to a range of about ±1V although the current detection unit 104 had an output rating of as large as ±10V. In this situation, a change in signal originating from the terahertz wave was about ±0.1 µA. In contrast, in the present example according to the embodiment of the invention, because the offset current was suppressed, the current detection unit 104 was allowed to deal, in detection, with only a change in signal originating from the terahertz wave. FIG. 9B illustrates an example of a measurement result obtained for the configuration according to the present example. As can be seen, this configuration allowed a suppression of the offset current down to a level of about 1 nA. Thus, as can be seen from FIG. 9B, the suppression of the offset current made it possible for the current detection unit 104 to have a current-to-voltage conversion ratio of as large as 100 MΩ, which made it possible to achieve a high-sensitivity detection of a change in signal originating from the terahertz wave. In general, the higher the current-to-voltage conversion ratio of the amplifier, the lower noise the amplifier has, and it is possible to amplify the signal component of the terahertz wave to a level close to the rating of the amplifier. This makes it possible to obtain a signal with a high signal-to-noise ratio.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-113829 filed May 18, 2010 and No. 2011-047736 filed Mar. 4, 2011, which are hereby incorporated by reference herein in their entirety.

What is claimed is:

1. A method of measuring a time-domain waveform of a terahertz wave based on time-domain spectroscopy, the method comprising:
    detecting, by a photoconductive device, a current signal including a current signal component originating from the terahertz wave;
    detecting a voltage signal corresponding to the detected current signal;
    at a pre-processing stage before the voltage signal detection, drawing an offset current that is included in the detected current signal and that has no relation to a change in electric field of the terahertz wave;
    monitoring the offset current based on the detected voltage signal and adjusting the magnitude of the drawn offset current according to a result of the monitoring; and
    acquiring a time-domain waveform of the terahertz wave based on the voltage signal detected while drawing the offset current,
    wherein the monitoring of the offset current and the adjusting of the offset current are performed in a waiting state in which measurement of the time-domain waveform of the terahertz wave is not performed.

2. The method according to claim 1, wherein the monitoring of the offset current and the adjusting of the offset current are performed such that a loop is formed between the voltage signal detection and the offset current drawing during the waiting state whereby the magnitude of the drawn offset current is determined such that the detected voltage signal is approximately equal to a reference potential in the voltage signal detection.

3. The method according to claim 1, wherein
the current signal detection includes providing a delay between a time at which excitation light arrives at a generating unit that generates the terahertz wave and a time at which the excitation light arrives at the photoconductive device, by adjusting the length of an optical path along which the excitation light travels by using an optical delay unit, and in the monitoring and adjusting of the offset current, the waiting state is provided in a period in which the optical delay unit moves from a position at which measurement is completed for a first time-domain waveform to a position at which measurement is started for a second time-domain waveform, and a signal output as a result of the voltage signal detection is monitored during the waiting state and the magnitude of the drawn offset current is determined based on a DC component included in the monitored signal.

4. The method according to claim 3, wherein in the monitoring and adjusting of the offset current, the movement of the optical delay unit during the waiting state is controlled such that a speed of a change in a signal output as a result of the current signal detection is greater than a value corresponding to a time constant of a measuring apparatus.

5. The method according to claim 1, wherein in the monitoring and adjusting of the offset current, an offset current waveform is acquired based on the detected voltage signal during the waiting state such that the value of the offset current is defined for each data element of a series of data forming the terahertz wave acquired, and the magnitude of the drawn offset current is adjusted for each data element.

6. The method according to claim 1, wherein in the monitoring and adjusting of the offset current, the terahertz wave is cut off such that the terahertz wave does not reach the photoconductive device during the waiting state.

7. A computer-readable storage medium storing a computer-executable program configured to cause a computer to perform the method according to claim 1.

8. An apparatus configured to measure a time-domain waveform of a terahertz wave based on time-domain spectroscopy, the apparatus comprising:
a sensor unit including a photoconductive device and configured to sense a current signal including a current signal component originating from the terahertz wave;
a current detection unit configured to detect the current signal output by the sensor unit and output a voltage signal corresponding to the current signal;
a current drawing unit configured to draw, at an input of the current detection unit, an offset current that is included in the current signal output by the sensor unit and is unrelated to a change in electric field of the terahertz wave;
an adjustment unit configured to monitor the offset current based on the voltage signal output from the current detection unit and adjust the magnitude of the offset current drawn by the current drawing unit;
a switching unit configured to selectively connect and disconnect a signal path between the current detection unit and the adjustment unit; and
a processing unit configured to acquire a time-domain waveform of the terahertz wave based on the voltage signal output from the current detection unit,
wherein the switching unit connects the signal path in a waiting state in which the processing unit does not perform the acquisition of the time-domain waveform and disconnects the signal path when the processing unit performs the acquisition of the time-domain waveform.

9. The apparatus according to claim 8, wherein a specimen is irradiated by a terahertz wave generated by a generating unit, the sensor unit senses the terahertz wave passing through or reflected from the specimen, and information associated with the specimen is acquired based on the time-domain waveform acquired by the processing unit.

10. A method of measuring a terahertz wave in time-domain, comprising:
generating excitation light using a light source unit;
irradiating a generating unit with the excitation light traveling along a first optical path to generate a terahertz wave;
irradiating a sensor unit with the excitation light traveling along a second optical path different from the first optical path;
establishing a waiting state in which the terahertz wave is not generated;
detecting, using the sensor unit, a current signal including at least one of a current signal component originating from the terahertz wave and an offset current component originating from the sensor unit;
detecting a voltage signal corresponding to the detected current signal;
drawing the offset current component from the detected current signal;
monitoring the offset current component based on the detected voltage signal and adjusting the magnitude of the drawn offset current component according to a result of the monitoring; and
acquiring a time-domain waveform of the terahertz wave based on the voltage signal detected while drawing the offset current component,
wherein the monitoring and the adjusting of the offset current component are performed during the waiting state.

11. The method according to claim 10, wherein, when the measuring apparatus is in the waiting state, a switching unit connects a current detection unit to an adjustment unit, and the adjustment unit monitors the output of the current detection unit, and
wherein, when the measuring apparatus is no in the waiting state, the switching unit disconnects the adjustment unit from the current detection unit and a processing unit measures the time-domain waveform of the terahertz wave.

12. The method according to claim 10, wherein, in the waiting state, the excitation light traveling along the second optical path arrives at the sensor unit before the terahertz wave pulse arrives at the sensor unit.

13. The method according to claim 10, wherein the waiting state is a state in which the terahertz wave is substantially cut off from arriving to the sensor unit.

* * * * *